(12) United States Patent
Futatsuyama

(10) Patent No.: US 9,047,951 B2
(45) Date of Patent: Jun. 2, 2015

(54) SEMICONDUCTOR MEMORY DEVICE

(71) Applicant: KABUSHIKI KAISHA TOSHIBA, Minato-ku (JP)

(72) Inventor: Takuya Futatsuyama, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 138 days.

(21) Appl. No.: 13/841,222

(22) Filed: Mar. 15, 2013

(65) Prior Publication Data

US 2014/0063964 A1 Mar. 6, 2014

(30) Foreign Application Priority Data

Aug. 29, 2012 (JP) ................................. 2012-188741

(51) Int. Cl.
| | |
|---|---|
| G11C 7/06 | (2006.01) |
| G11C 16/04 | (2006.01) |
| G11C 16/06 | (2006.01) |
| G11C 16/26 | (2006.01) |

(52) U.S. Cl.
CPC ........ *G11C 16/04* (2013.01); *G11C 7/06* (2013.01); *G11C 16/0483* (2013.01); *G11C 16/06* (2013.01); *G11C 16/26* (2013.01)

(58) Field of Classification Search
CPC ........................................................ G11C 7/06
USPC ................................................. 365/189.011
See application file for complete search history.

(56) References Cited

U.S. PATENT DOCUMENTS

| | | | |
|---|---|---|---|
| 7,700,997 B2 | 4/2010 | Futatsuyama et al. | |
| 7,795,689 B2 | 9/2010 | Kawakita | |
| 7,851,914 B2 | 12/2010 | Masukawa et al. | |
| 8,169,824 B2 | 5/2012 | Endo et al. | |
| 2001/0002713 A1* | 6/2001 | Goda et al. ..................... | 257/315 |
| 2010/0258873 A1 | 10/2010 | Harashima et al. | |
| 2011/0001193 A1* | 1/2011 | Yamada et al. ................ | 257/369 |
| 2012/0193697 A1* | 8/2012 | Takemura ....................... | 257/306 |

FOREIGN PATENT DOCUMENTS

| | | | | |
|---|---|---|---|---|
| JP | 402030179 A | * | 1/1990 | ................ 365/174 |
| JP | 2005-129596 | | 5/2005 | |
| JP | 2008-028324 | | 2/2008 | |
| JP | 2009-259975 | | 11/2009 | |
| JP | 2010-182939 | | 8/2010 | |
| JP | 2010-245454 | | 10/2010 | |

* cited by examiner

*Primary Examiner* — Hoai V Ho
*Assistant Examiner* — Min Huang
(74) *Attorney, Agent, or Firm* — Oblon, McClelland, Maier & Neustadt, L.L.P.

(57) ABSTRACT

According to an embodiment, sense amplifiers are arranged one by one within an arrangement width of k bit lines in a direction of the bit lines, and determine data stored in the memory cells, based on potentials of the respective bit lines. Transistors constituting the sense amplifier are arranged one by one within an arrangement width of the sense amplifier in the direction of the bit lines. A gate length direction of the transistors is identical to the direction of the bit lines. A longer side direction of a contact electrode connected to an active area of the transistor is identical to the direction of the bit lines.

16 Claims, 9 Drawing Sheets

FIG.9A
FIG.9B
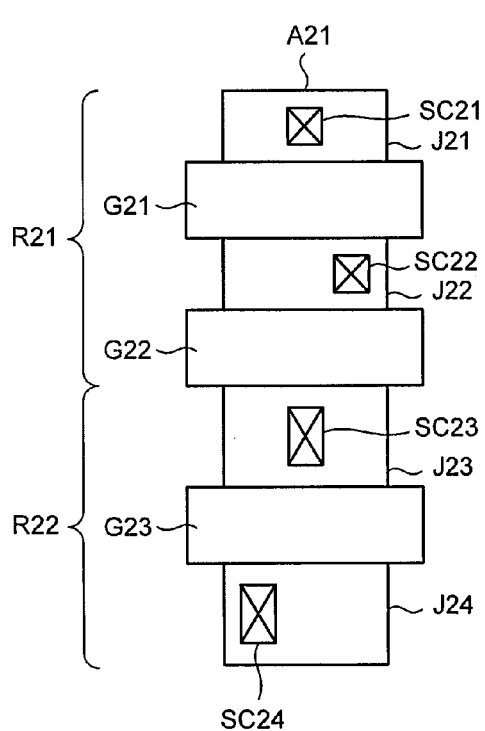
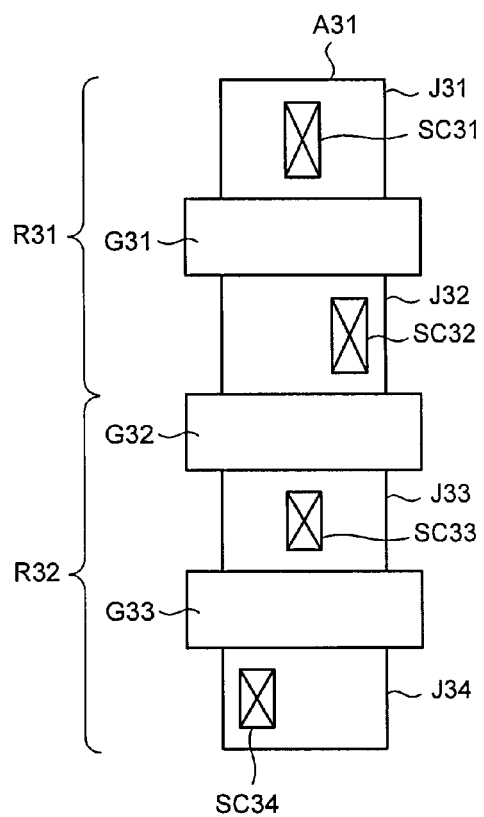

US 9,047,951 B2

SEMICONDUCTOR MEMORY DEVICE

CROSS-REFERENCE TO RELATED APPLICATIONS

This application is based upon and claims the benefit of priority from Japanese Patent Application No. 2012-188741, filed on Aug. 29, 2012; the entire contents of which are incorporated herein by reference.

FIELD

Embodiments described herein relate generally to semiconductor memory devices.

BACKGROUND

An arrangement pitch of bit lines is reduced in accordance with the miniaturization of memory cells used for a NAND flash memory. Therefore, sense amplifiers existing as many as the number of the bit lines are also scaled down, and contact regions of the sense amplifiers are also miniaturized. As a result, an area for sufficiently reducing the contact resistance of the contact of the sense amplifier has not been secured and accordingly poor contact has frequently occurred.

BRIEF DESCRIPTION OF THE DRAWINGS

FIG. 9A is a top view illustrating a layout configuration example of transistors used for a sense amplifier according to a second embodiment, and FIG. 9B is a top view illustrating a layout configuration example of transistors used for a sense amplifier according to a third embodiment.

DETAILED DESCRIPTION

According to a semiconductor memory device of an embodiment, memory cell arrays, word lines, m bit lines (m is an integer not less than 2), and k sense amplifiers (k is an integer not less than 2 and not more than m) are provided. The memory cell arrays are arranged in a matrix form in a row direction and a column direction. The word lines select the memory cells in the row direction. The bit lines select the memory cells in the column direction. The sense amplifiers are arranged one by one within the arrangement width of the k bit lines in the direction of the bit line, and determine values stored in the memory cells, based on potentials of the respective bit lines. Herein, transistors constituting the sense amplifier are arranged one by one within the arrangement width of the sense amplifier in the direction of the bit line. A gate length direction of the transistor is identical to the direction of the bit line, and a longer side direction of a contact electrode connected to an active area of the transistor is identical to the direction of the bit line.

Hereinafter, semiconductor memory devices according to embodiments will be described with reference to the drawings. Also, the present invention is not limited by these embodiments.

First Embodiment

Figure 1:
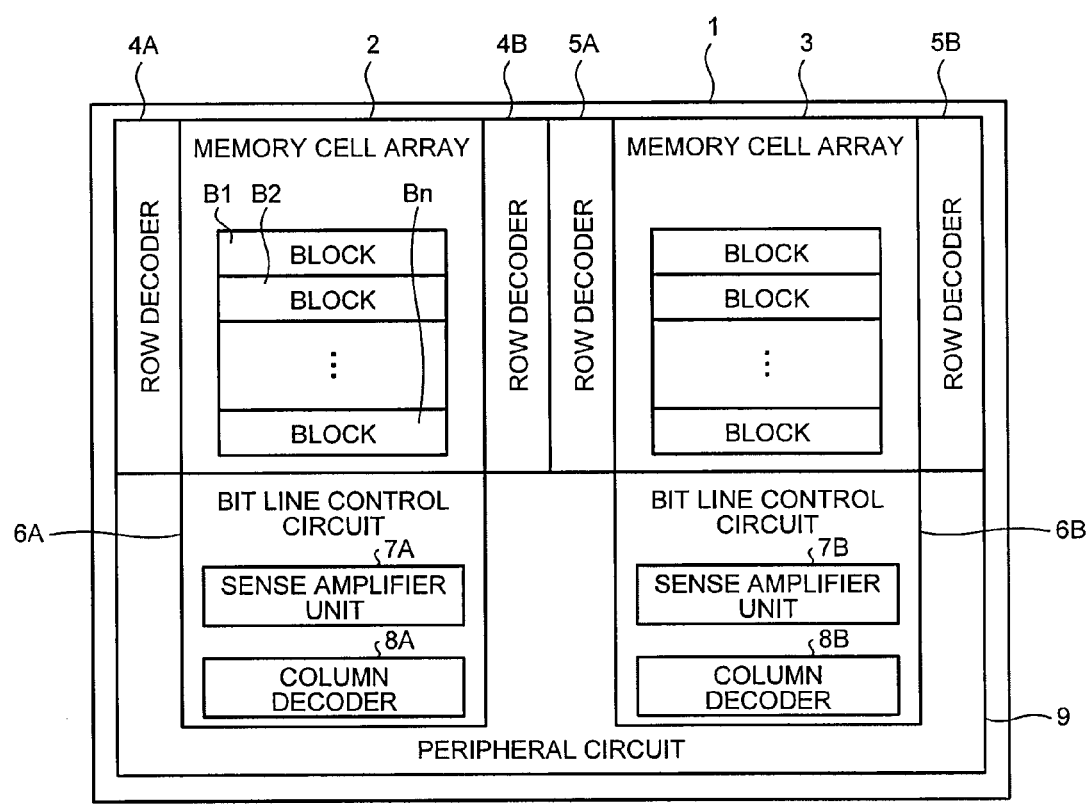
FIG. 1 is a top view illustrating a layout configuration of a semiconductor memory device according to a first embodiment.

FIG. 1 is a top view illustrating a layout configuration of a semiconductor memory device according to a first embodiment.

In FIG. 1, memory cell arrays 2 and 3, row decoders 4A, 4B, 5A and 5B, bit line control circuits 6A and 6B, and a peripheral circuit 9 are formed in a semiconductor chip 1. Herein, the row decoders 4A and 4B, and the bit line control circuit 6A are provided corresponding to the memory cell array 2, and the row decoders 5A and 5B and the bit line control circuit 6B are provided corresponding to the memory cell array 3. Sense amplifier units 7A and 7B and column decoders 8A and 8B are provided in the bit line control circuits 6A and 6B, respectively.

In each of the memory cell arrays 2 and 3, memory cells configured to store data are arranged in a matrix form in a row direction and a column direction. Also, one memory cell may be configured to store data of 1 bit, or may be multivalued to store data of 2 bits or more.

Herein, each of the memory cell arrays 2 and 3 is divided into n blocks B1 to Bn (n is a positive integer). Also, each of the blocks B1 to Bn may be configured by arranging a plurality of NAND cell units in a row direction.

Figure 2:
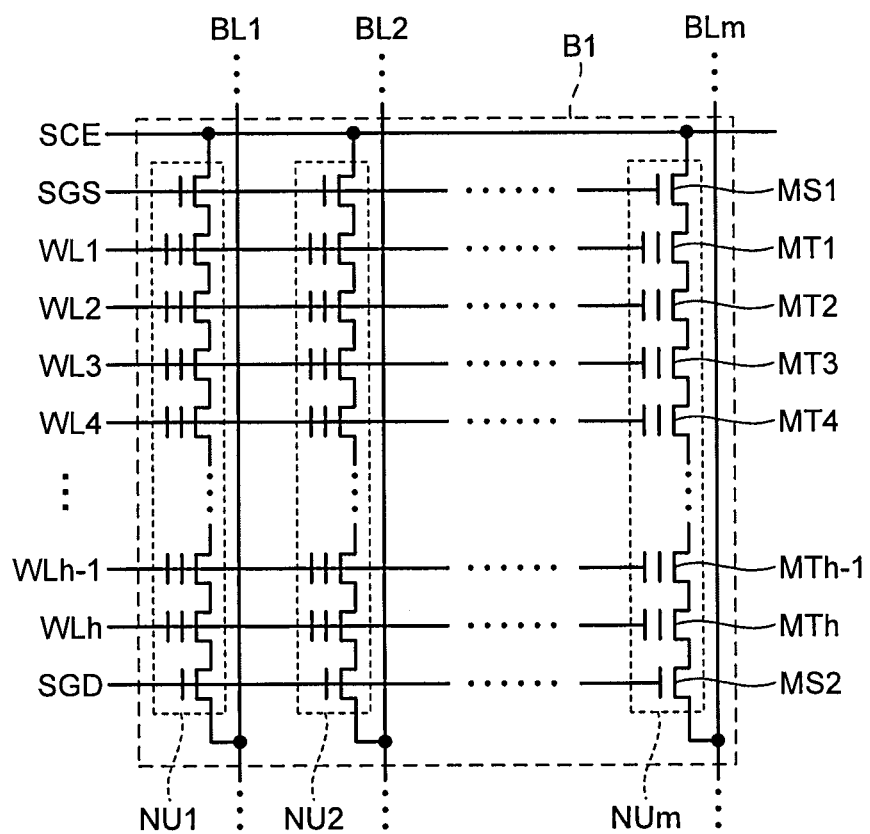
FIG. 2 is a circuit diagram illustrating a schematic configuration of a block of the semiconductor memory device of FIG. 1.

FIG. 2 is a circuit diagram illustrating a schematic configuration of the block of the semiconductor memory device of FIG. 1.

In FIG. 2, in each of the blocks B1 to Bn, h word lines WL1 to WLh (h is a positive integer), select gate lines SGD and SGS, and a source line SL are provided. Also, in each of the blocks B1 to Bn, m bit lines BL1 to BLm (m is a positive integer) are commonly provided.

In each of the blocks B1 to Bn, m NAND cell units NU1 to NUm are provided, and the NAND cell units NU1 to NUm are connected to the bit lines BL1 to BLm, respectively.

Herein, in each of the NAND cell units NU1 to NUm, cell transistors MT1 to MTh and select transistors MS1 and MS2 are provided. Also, one memory cell of the memory cell array 1 may be constituted by one cell transistor. The respective NAND cell units NU1 to NUm are configured in such a manner that a NAND string is constituted by connecting the cell transistors MT1 to MTh in series, and the select transistors MS1 and MS2 are connected to both ends of the NAND string.

In the respective NAND cell units NU1 to NUm, the word lines WL1 to WLh are connected to control gate electrodes of the cell transistors MT1 to MTh, respectively. Also, in the respective NAND cell units NU1 to NUm, one ends of the NAND strings constituted by the cell transistors MT1 to MTh are connected to the bit lines BL1 to BLm through the select transistor MS2, respectively, and the other ends of the NAND strings are connected to the source line SL through the select transistor MS1.

Also, in FIG. 1, the row decoders 4A and 4B may select the memory cells of the row direction of the memory cell array 2 during the read operation, the write operation, and the erase operation of the memory cells. The row decoders 5A and 5B may select the memory cells of the row direction of the memory cell array 3 during the read operation, the write operation, and the erase operation of the memory cells. The bit line control circuit 6A may perform bit line control of the memory cell array 2. The bit line control circuit 6B may perform bit line control of the memory cell array 3. The column decoder 8A may select the memory cells of the column direction of the memory cell array 2 during the read operation, the write operation, and the erase operation of the memory cells. The column decoder 8B may select the memory cells of the column direction of the memory cell array 3 during the read operation, the write operation, and the erase operation of the memory cells. The sense amplifier unit 7A may determine values stored in the memory cells, based on the potentials of the bit lines BL1 to BLm of the memory cell array 2, or may control the potentials of the bit lines BL1 to BLm according to write data. The sense amplifier unit 7B may determine values stored in the memory cells, based on the potentials of the bit lines BL1 to BLm of the memory cell array 3, or may control the potentials of the bit lines BL1 to BLm according to write data. The peripheral circuit 9 may perform the command or address transfer received from the external input, or may control the operations of the row decoders 4A, 4B, 5A and 5B and the bit line control circuits 6A and 6B, based on the command and/or address input.

In the write operation, a write voltage (for example, 20 V) is applied to the selected word line of the selected block. Also, for example, an intermediate voltage (for example, 10 V) enough to turn on the cell transistor is applied to the unselected word lines. Also, due to a channel cut, a low voltage for preventing the cell transistor from being turned on may be applied to a part of the unselected word lines. Also, a write voltage (for example, 0 V) or a write inhibit voltage (for example, 2.5 V) is applied to the selected bit line according to write data.

Also, a voltage, for example, 2.5 V, sufficient for the selected transistor MS2 to transfer the write voltage, and to turn off and not fully transfer the write inhibit voltage, is applied to the select gate line SGD. Also, a low voltage enough to turn off the select transistor MS1 is applied to the select gate line SGS.

When the write voltage is applied to the selected bit lines through the sense amplifier units 7A and 7B, a high voltage is applied to the control gate electrode of the selected cell. Therefore, a potential of a charge accumulation layer of the selected cell is raised. Hence, charges are injected from the channel of the selected cell to the charge accumulation layer by tunneling, and the threshold value of the selected cell is raised. In this manner, the write operation of the selected cell is performed.

On the other hand, when the write inhibit voltage is applied to the selected bit line through the sense amplifier units 7A and 7B, the select transistor MS2 is turned off. As a result, due to self boost, the potential of the channel of the selected cell connected to the selected word line is raised, and a potential difference across a tunnel film of the selected cell is reduced. Therefore, it is difficult for charges to be injected from the channel of the selected cell to the charge accumulation layer, and the threshold value of the selected cell is not almost raised. The write inhibit operation of the selected cell is performed.

In the read operation, the read voltage (for example, 0 V) is applied to the selected word line of the selected block, and the intermediate voltage (for example, 4.5 V) enough to turn on the unselected cell is applied to the unselected word line. Also, the intermediate voltage (for example, 4.5 V) enough to turn on the select transistors MS1 and MS2 is applied to the select gate lines SGD and SGS. Also, a precharge voltage is applied to the selected bit line, and 0 V is applied to the source line SL.

In this case, when the threshold value of the selected cell does not reach a read level, the charges charged in the selected bit line are discharged through the NAND string. Therefore, the potential of the selected bit line becomes a low level. On the other hand, when the threshold value of the selected cell reaches the read level, the charges charged in the selected bit line are not almost discharged through the NAND string. Therefore, the potential of the selected bit line maintains a high level close to the precharge voltage.

The sense amplifier units 7A and 7B determine whether the threshold value of the selected cell reaches the read level by determining whether the potential of the selected bit line is the low level or the high level, and data stored in the selected cell is read.

Figure 3:
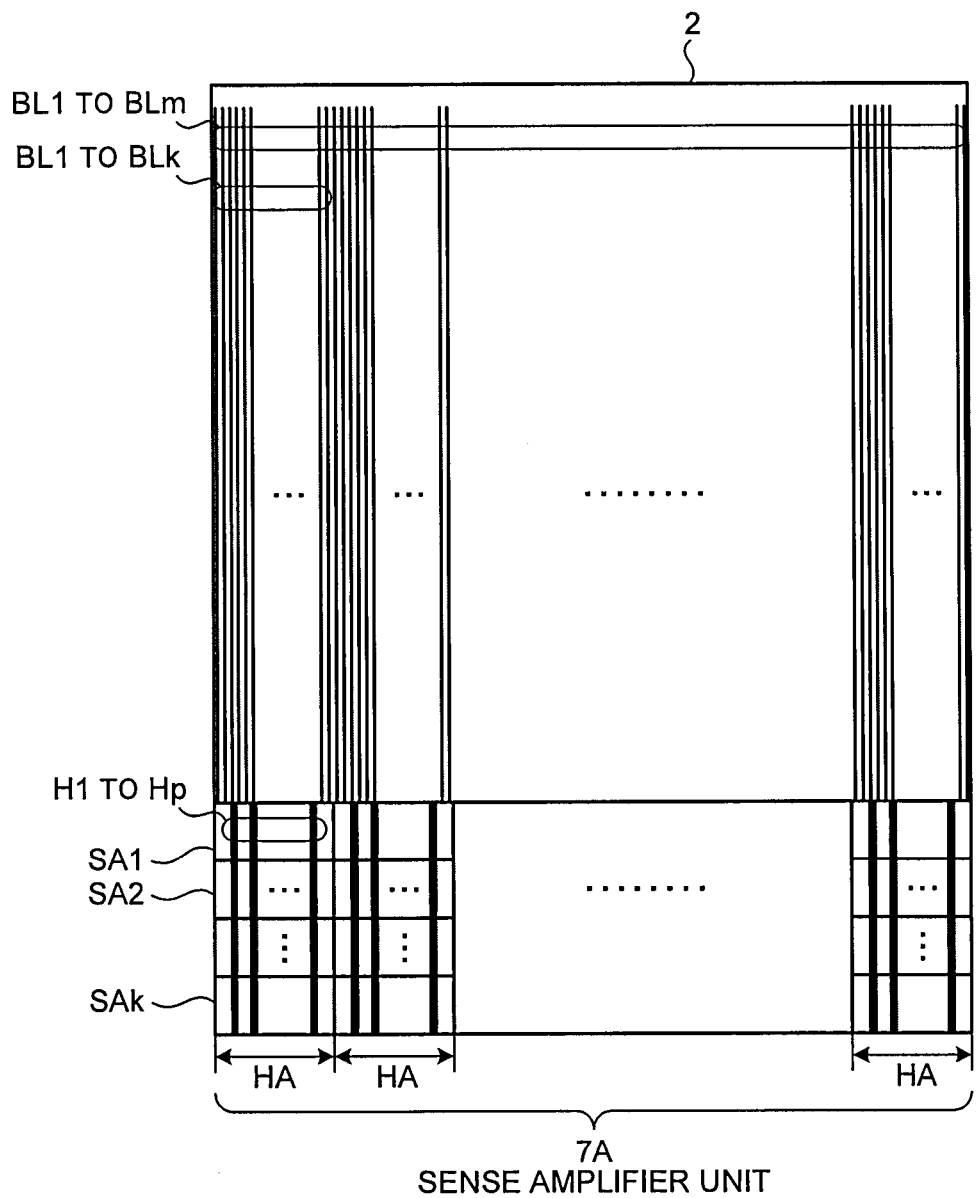
FIG. 3 is a block diagram illustrating an arrangement example of sense amplifiers corresponding to the number of bit lines of a memory cell array of FIG. 1.

FIG. 3 is a block diagram illustrating an arrangement example of the sense amplifiers corresponding to the number of the bit lines of the memory cell array of FIG. 1.

In FIG. 3, the m bit lines BL1 to BLm are divided into k bit lines BL1 to BLk (k is an integer equal to or greater than 2 and equal to or less than m). Also, in order to facilitate a binary operation, it is preferable that k be the power of 2. In the sense amplifier unit 7A, sense amplifiers SA1 to SAk are provided at the bit lines BL1 to BLk, respectively. Herein, the sense amplifiers SA1 to SAk are arranged one by one within the arrangement width HA of the k bit lines BL1 to BLk in the direction of the bit line. Therefore, when the arrangement pitch of the bit lines BL1 to BLm is assumed as PH, k×PH may be secured as the width of the respective sense amplifiers SA1 to SAk.

For example, when the arrangement pitch of the bit lines BL1 to BLm is 64 nm and k is 16, the arrangement width HA is 1,024 nm and the sense amplifiers SA1 to SAk are arrangement into 16 stages in the direction of the bit line. Alternatively, as the miniaturization proceeds, for example, in the case where the arrangement pitch of the bit lines BL1 to BLm becomes 32 nm and the arrangement width of the sense amplifiers SA1 to SAk may not be secured at k=16, k is set to 32 and the sense amplifiers SA1 to SAk are arranged into 32 stages in the direction of the bit line.

In the sense amplifiers SA1 to SAk, p wirings H1 to Hp (p is an integer equal to or less than 2 and equal to or less than k) are provided within the arrangement width HA in the direction of the bit line. Also, in order to stably perform lithography, it is preferable that the width and interval of the wirings H1 to Hp be equal and constant. Also, as the wirings of the sense amplifiers SA1 to SAk, five wirings are required. That is, two wirings for transfer of complementary data, a power line, a wiring between latches, and a wiring between the sense amplifiers are required. Also, six wirings may be provided by adding a shield wiring for preventing latched data from being inverted by capacitive coupling between wirings.

Figure 4:
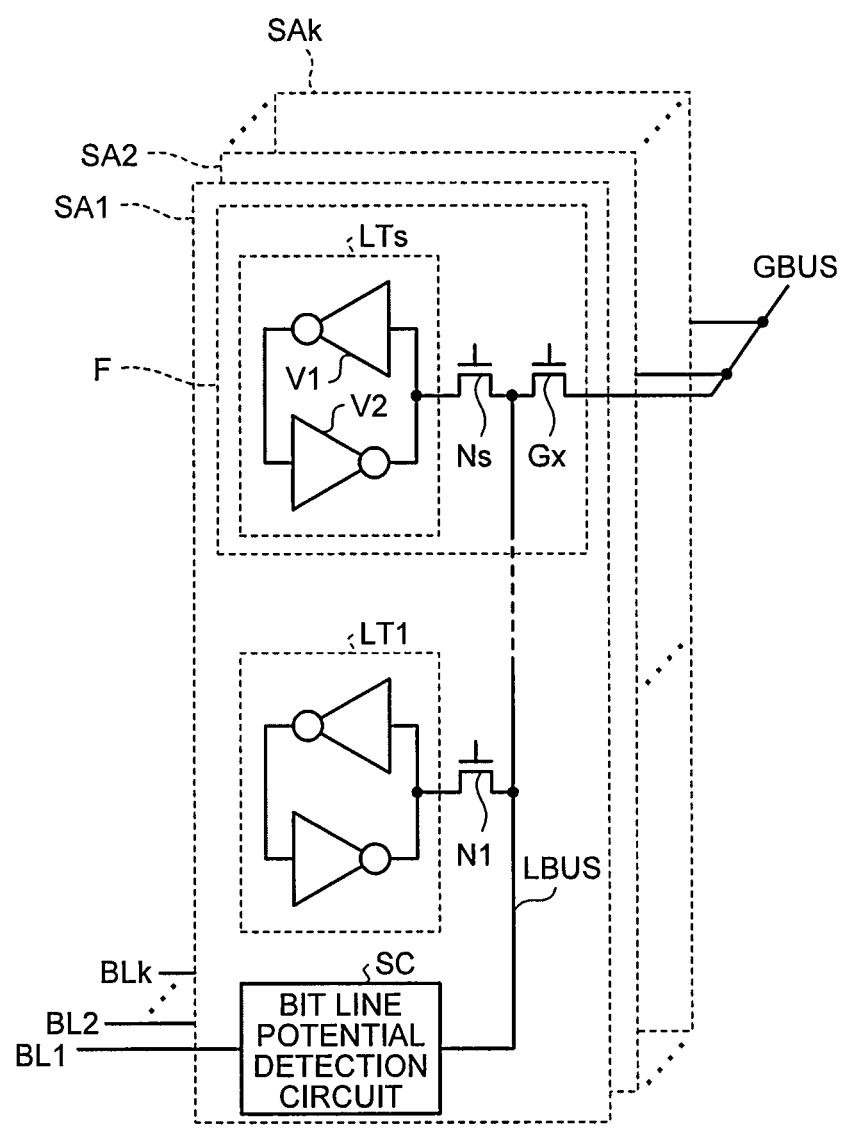
FIG. 4 is a circuit diagram illustrating a configuration example of one sense amplifier of FIG. 3.

FIG. 4 is a circuit diagram illustrating a configuration example of one sense amplifier of FIG. 3.

In FIG. 4, bit line potential detection circuits SC of the sense amplifiers SA1 to SAk are connected to the bit lines BL1 to BLk, respectively. Also, for example, in the sense amplifier SA1, s latch circuits LT1 to LTs (s is a positive integer), s local transfer transistors N1 to Ns, a global transfer transistor Gx, and a bit line potential detection circuit SC are provided. Herein, in each of the latch circuits LT1 to LTs, inverters V1 and V2 are provided. An output of the inverter V1 is connected to an input of the inverter V2, and an output of the inverter V2 is connected to an input of the inverter V1. Also, outputs of the latch circuits LT1 to LTs are connected to a local bus LBUS through the local transfer transistors, N1 to Ns, respectively, and the local bus line LBUS is connected to the bit line potential detection circuit SC. Also, the local bus LBUS may perform a data transfer between the latch circuits LT1 to LTs within the sense amplifier SA1. Also, the local bus LBUS is connected to the global bus GBUS through the global transfer transistor Gx. Also, the data transfer of the sense amplifiers SA1 to SAk may be performed through the global bus GBUS.

Figure 5:
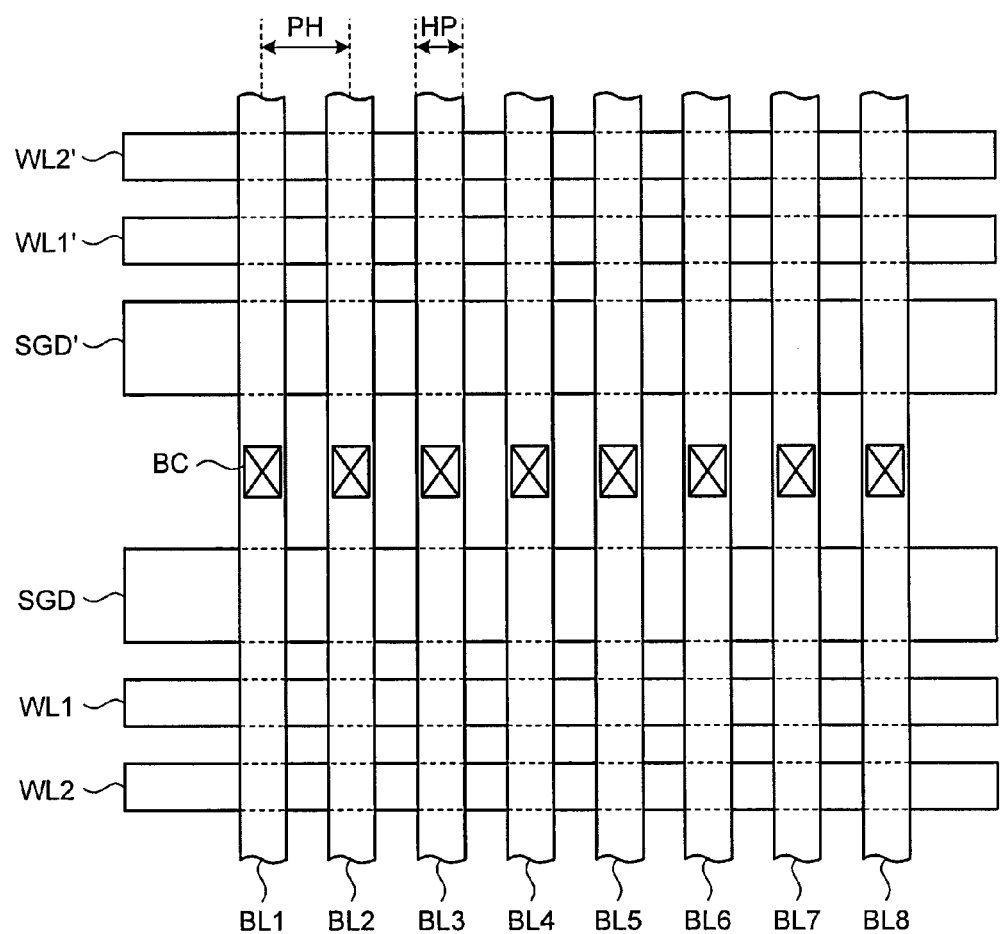
FIG. 5 is a top view illustrating a layout configuration example of the surrounding of bit contacts of the memory cell array of FIG. 1.

FIG. 5 is a top view illustrating a layout configuration example of the surrounding of the bit contacts of the memory cell array of FIG. 1.

In FIG. 5, the bit lines BL1 to BL8 are arranged in parallel at the arrangement pitch PH in a direction perpendicular to the arrangement direction thereof. Also, the arrangement pitch PH of the bit lines BL1 to BL8 may correspond to the minimum pitch of a line & space in their direction of a semiconductor integrated circuit. Also, the width HP of each of the bit lines BL1 to BL8 may correspond to approximately half pitch (½ of the minimum pitch) in the semiconductor integrated circuit.

Also, the word lines WL1, WL2, WL' and WL2' and the select gate lines SGD and SGD' are arranged in parallel with the direction perpendicular to the arrangement direction of the bit lines BL1 to BL8. Herein, bit line contact electrodes BC are provided between the select gate lines SGD and SGD'. The upper ends of the bit line contact electrodes BC are connected to the bit lines BL1 to BL8, and the lower ends of the bit line contact electrodes BC are connected to high-concentration impurity diffusion layers formed between the select gate lines SGD and SGD' in active areas isolated by trenches.

Figure 6:
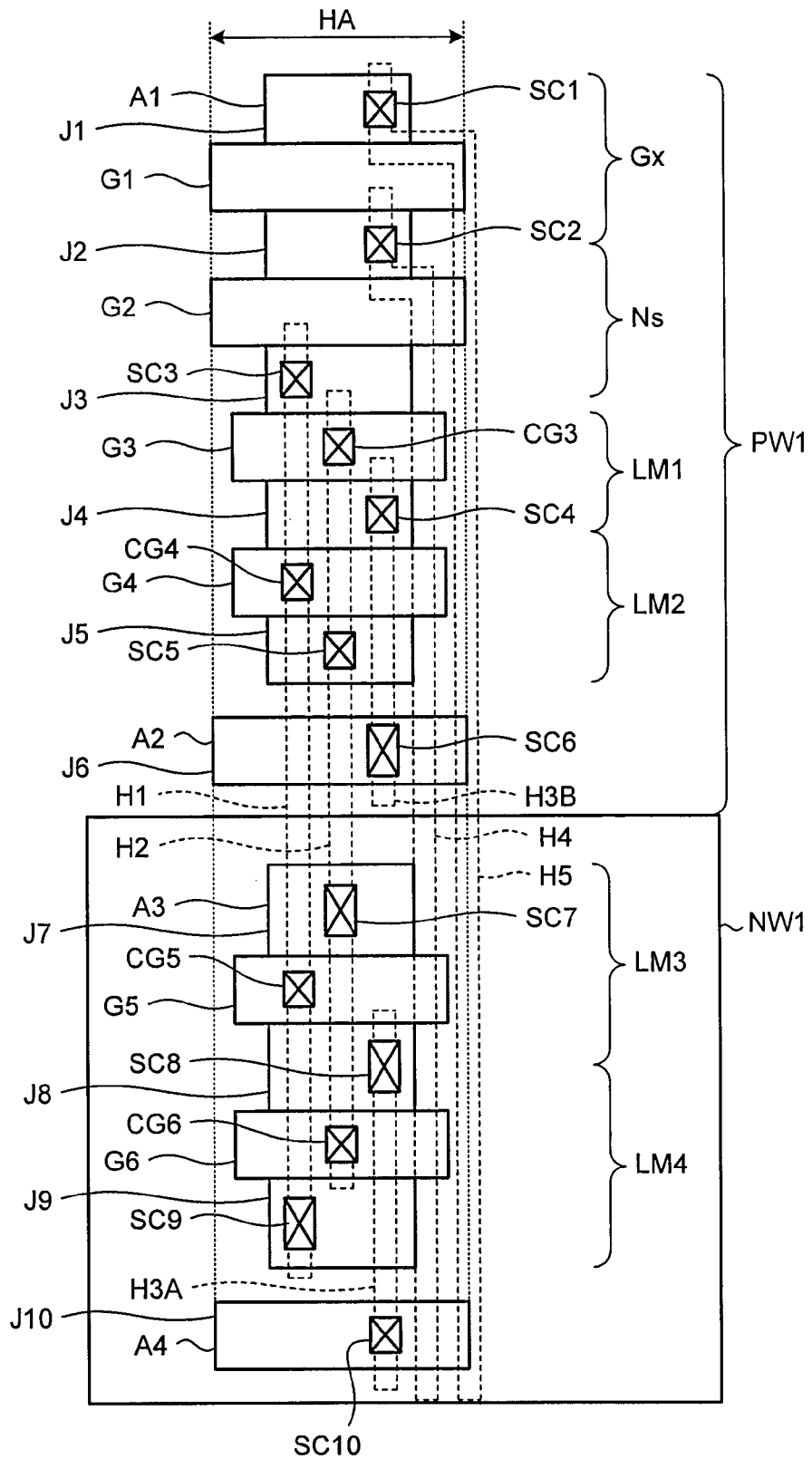
FIG. 6 is a top view illustrating a layout configuration example of a portion F of FIG. 4.

FIG. 6 is a top view illustrating a layout configuration example of a portion F of FIG. 4.

In FIG. 6, latch transistors LM1 and LM4 are provided in the inverter V1 of FIG. 4, and latch transistors LM2 and LM3 are provided in the inverter V2 of FIG. 4. Within the arrangement width HA of the sense amplifier SA1, the local transfer transistor Ns, the global transfer transistor Gx, and the latch transistors LM1 to LM4 are arranged one by one in the direction of the bit line. Also, the local transfer transistor Ns, the global transfer transistor Gx, and the latch transistors LM1 and LM2 may use N-channel field-effect transistors, and the latch transistors LM3 and LM4 may use P-channel field-effect transistors.

That is, the active areas A1 and A2 are provided in a P well PW1, and the active areas A3 and A4 are provided in an N well NW1. Gate electrodes G1 to G4 are arranged to cross the active area A1 in a direction perpendicular to the bit lines, and N-type impurity diffusion layers J1 to J5 are formed in the respective active areas A1 partitioned by the gate electrodes G1 to G4. Also, gate electrodes G5 and G6 are arranged to cross the active area A3 in a direction perpendicular to the bit lines, and P-type impurity diffusion layers J7 to J9 are formed in the respective active areas A3 partitioned by the gate electrodes G5 and G6. That is, the gate length direction of the gate electrodes G1 to G6 is identical to the direction of the bit lines. Also, a P-type impurity diffusion layer J6 is formed in the active area A2, and an N-type impurity diffusion layer J10 is formed in the active area A4. Also, the P-type impurity diffusion layer J6 may constitute a guard ring of the P well PW1 and may apply 0 V. The N-type impurity diffusion layer J10 may constitute a guard ring of the N well NW1 and may apply a power supply voltage of an internal chip (for example, about 1.8 V to 3 V).

Herein, the local transfer transistor Ns, the global transfer transistor Gx, and the latch transistors LM1 to LM4 are arranged one by one in the direction of the bit line, and the gate length direction of the gate electrodes G1 to G6 is made to be identical to the direction of the bit line. In this manner, the gate length of the gate electrodes G1 to G6 and the interval between the gate electrodes G1 to G6 may be made not to be restricted by the arrangement width HA of the sense amplifier SA1. Therefore, even when the arrangement width HA of the sense amplifier SA1 is narrow, the contact areas between the gate electrodes G1 to G6 may be secured while the gate length of the gate electrodes G1 to G6 is secured.

Also, wirings H1, H2, H3A, H3B, H4 and H5 are arranged in the direction of the bit line. Also, the wirings H1 and H2 may be used as wirings to transfer complementary data, the wiring H4 may be used as a wiring between the latches, the wiring H5 may be used as a wiring between the sense amplifiers, and the wirings H3A and H3B may be used as a power line. Since the wirings H3A and H3B may be arranged on the same wiring track, the area corresponding to one wiring track has only to be secured.

The wiring H1 is connected to the N-type impurity diffusion layer J3 between the gate electrodes G2 and G3 through a contact electrode SC3, and is connected to the P-type impurity diffusion layer J9 of one side of the gate electrode G6 through a contact electrode SC9. Also, the wiring H1 is connected to the gate electrodes G4 and G5, respectively, through contact electrodes CG4 and CG5.

The wiring H2 is connected to the N-type impurity diffusion layer J5 of one side of the gate electrode G4 through a contact electrode SC5, and is connected to the P-type impurity diffusion layer J7 of one side of the gate electrode G5 through a contact electrode SC7. Also, the wiring H2 is connected to the gate electrodes G3 and G6, respectively, through contact electrodes CG3 and CG6.

The wiring H3A is connected to the P-type impurity diffusion layer J8 between the gate electrodes G5 and G6 through a contact electrode SC8, and is connected to the N-type impurity diffusion layer J10 through a contact electrode SC10. The wiring H3B is connected to the N-type impurity diffusion layer J4 between the gate electrodes G3 and G4 through a contact electrode SC4, and is connected to the P-type impurity diffusion layer J6 through a contact electrode SC6.

The wiring H4 is connected to the N-type impurity diffusion layer J2 between the gate electrodes G1 and G2 through a contact electrode SC2. The wiring H5 is connected to the N-type impurity diffusion layer J1 of one side of the gate electrode G1 through a contact electrode SC1.

Herein, the contact electrodes SC1 to SC10 and CG3 to CG6 may be arranged such that the longer side direction of the contact electrodes SC1 to SC10 and CG3 to CG6 is made to be identical to the direction of the bit line. By this configuration, even when the arrangement width HA of the sense amplifier SA1 is narrow, the contact area of the contact electrodes SC1 to SC10 and CG3 to CG6 may be increased, making it possible to reduce contact failure. Also, by aligning the longer side direction of the contact electrodes SC1 to SC10 and CG3 to CG6, it becomes easy to secure a lithography margin, making it possible to cope with the miniaturization of the contact electrodes SC1 to SC10 and CG3 to CG6.

Also, it is preferable that the longer side of the contact electrodes SC7 to SC9 be greater than the longer side of the contact electrodes SC1 to SC5. In this manner, even when it is difficult to secure an ohmic contact property on a p-type Si side rather than an n-type Si side, the contact electrodes SC7 to SC9 may secure the same ohmic property as the contact electrodes SC1 to SC5.

Figure 7:
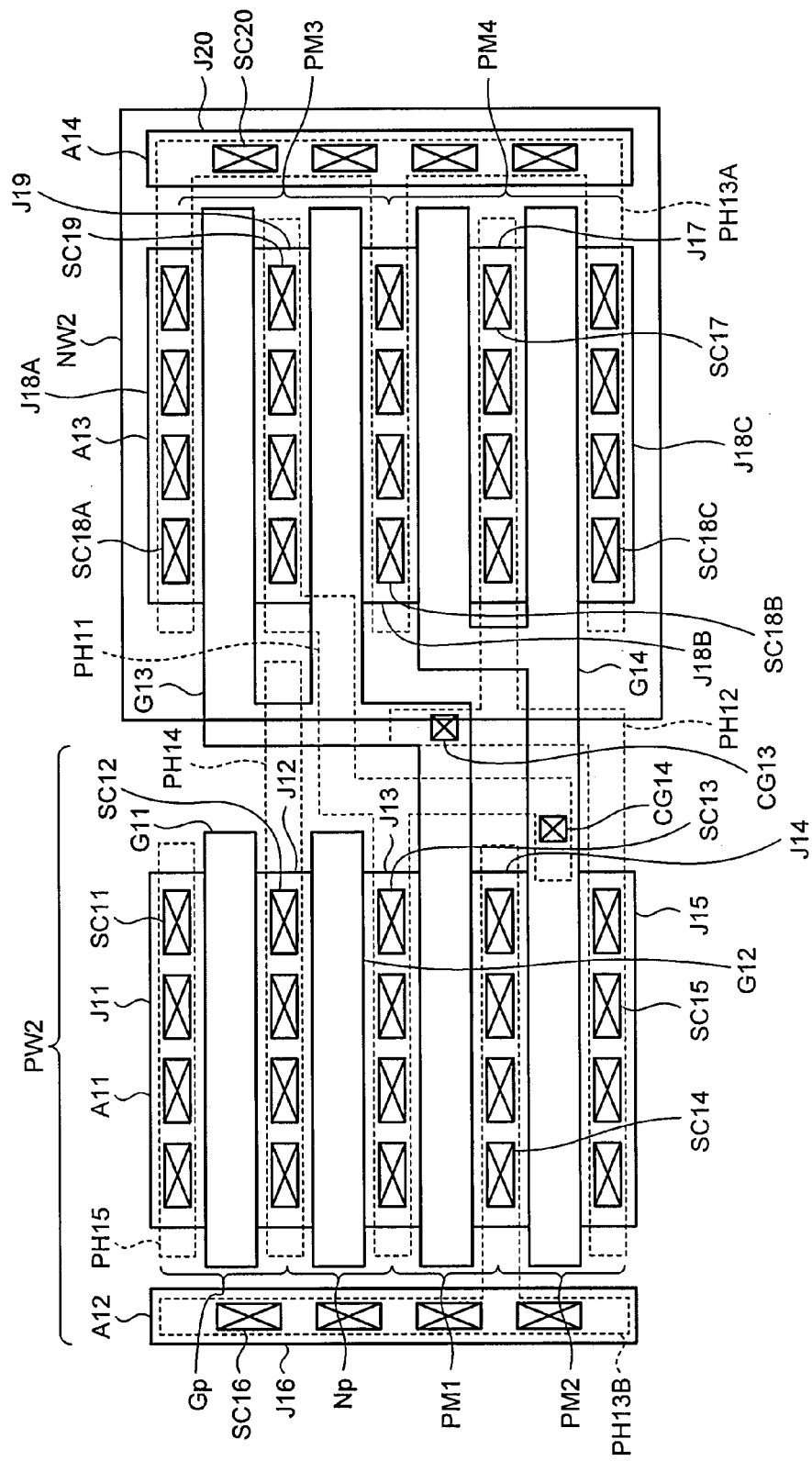
FIG. 7 is a top view illustrating a layout configuration example of a latch circuit arranged in a peripheral circuit of FIG. 1.

FIG. 7 is a top view illustrating a layout configuration example of the latch circuit arranged in the peripheral circuit of FIG. 1.

In FIG. 7, a local transfer transistor Np, a global transfer transistor Gp, and latch transistors PM1 to PM4 are provided in the latch circuit. Herein, in the layout of FIG. 6, the local transfer transistor Ns, the global transfer transistor Gx, and the latch transistors LM1 to LM4 are arranged one by one in the direction of the bit line. That is, the transistors are arranged in a direction in which the boundary between the N well NW1 and the P well PW1 is perpendicular to the gate length direction of the transistors. On the other hand, in the layout of FIG. 7, the local transfer transistor Np, the global transfer transistor Gp, and the latch transistors PM1 to PM4 are arranged side by side in a direction in which the boundary between the N well NW2 and the P well PW2 is parallel with the gate length direction of the transistors.

Active areas A11 and A12 are provided in the P well PW2, and active areas A13 and A14 are provided in the N well NW2. Gate electrodes G11 and G12 are arranged to cross the active area A11 in a direction parallel with the boundary between the N well NW2 and the P well PW2. Although G11 and G12, in practice, are connected to the wirings through the contact electrodes, the illumination thereof is not omitted herein for simplicity of the drawing. Also, gate electrodes G13 and G14 are arranged to cross the active areas A11 and A13 in a direction perpendicular to the boundary of the N well NW2 and the P well PW2. N-type impurity diffusion layers J11 to J15 are formed in the respective active areas A11, partitioned by the gate electrodes G11 to G14. Also, P-type impurity diffusion layers J17, J18A to J18C, and J19 are formed in the respective active areas A13 partitioned by the gate electrodes G13 and G14. Also, a P-type impurity diffusion layer J16 is formed in the active area A12, and an N-type impurity diffusion layer J20 is formed in the active area A14. Also, the P-type impurity diffusion layer J16 may constitute a guard ring of the P well PW2, where 0V is applied. The N-type impurity diffusion layer J20 may constitute a guard ring of the N well NW2, where an internal power supply voltage in a chip (for example, about 1.8 V to 3 V) is applied.

As illustrated in FIG. 7, in the transistor layout patterns arranged in the peripheral circuit, the wiring width, the contact shape or the gate width of the transistor, and the like are large and the space also is wide, as compared with the transistor layout patterns arranged in the sense amplifier unit illustrated in FIG. 6. Therefore, there is no limitation to the arrangement direction with respect to the bit lines.

A wiring PH11 is connected to the N-type impurity diffusion layer J13 between the gate electrodes G12 and G13 through a contact electrode SC13, and is connected to the P-type impurity diffusion layer J19 between the gate electrodes G13 through the contact electrode SC19. Also, the wiring PH11 is connected to the gate electrode G14 through a contact electrode CG14.

A wiring PH12 is connected to the N-type impurity diffusion layer J15 of one side of the gate electrode G14 through a contact electrode SC15, and is connected to the P-type impurity diffusion layer J17 between the gate electrodes G14 through the contact electrode SC17. Also, the wiring PH12 is connected to the gate electrode G13 through a contact electrode CG13.

A wiring PH13A is connected to the P-type impurity diffusion layer J18C of one side of the gate electrode G14 through a contact electrode SC18C, is connected to the P-type impurity diffusion layer J18A of one side of the gate electrode G13 through a contact electrode SC18A, is connected to the P-type impurity diffusion layer J18B between the gate electrodes G13 and G14 through a contact electrode SC18B, and is connected to the N-type impurity diffusion layer J20 through a contact electrode SC20. A wiring PH13B is connected to the N-type impurity diffusion layer J14 between the gate electrodes G13 and G14 through a contact electrode SC14, and is connected to the P-type impurity diffusion layer J16 through a contact electrode SC16.

A wiring PH14 is connected to the N-type impurity diffusion layer J12 between the gate electrodes G11 and G12 through a contact electrode SC12. A wiring PH15 is connected to the N-type impurity diffusion layer J11 of one side of the gate electrode G11 through a contact electrode SC11.

Figures 8A, 8B:
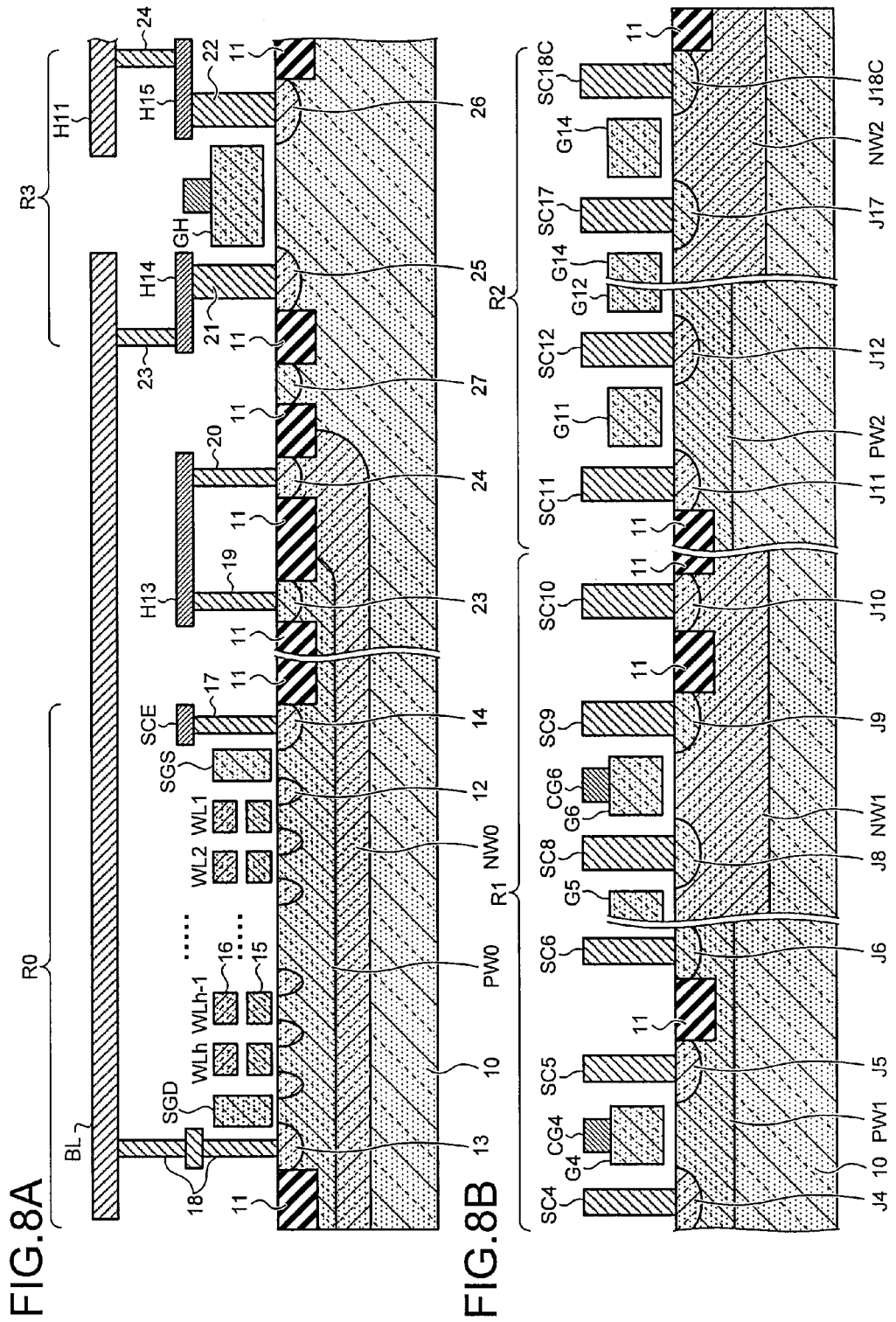
FIGS. 8A and 8B are cross-sectional views illustrating a configuration example of a NAND cell unit of FIG. 2, transistors used for the sense amplifier of FIG. 3, and transistors used for the peripheral circuit of FIG. 7.

FIGS. 8A and 8B are cross-sectional views illustrating a configuration example of the NAND cell unit of FIG. 2, the transistors used for the sense amplifier of FIG. 3, and the transistors used for the peripheral circuit of FIG. 7. Also, FIG. 8B illustrates a partial cut-away view of the layouts of FIGS. 6 and 7.

In FIGS. 8A and 8B, a cell array region R0, a sense amplifier region R1, a peripheral region R2, and a high-breakdown-voltage transistor region R3 are provided in a semiconductor substrate 10. Also, a material of the semiconductor substrate 10 may be selected from, for example, Si, Ge, SiGe, GaAs, AlGaAs, Inp, GaP, InGaAs, GaN, and SiC. Also, the memory cell array of FIG. 5 may be arranged in the cell array region R0, the sense amplifier of FIG. 6 may be disposed in the sense amplifier region R1, the peripheral circuit of FIG. 7 may be arranged in the peripheral region R2, and the high-breakdown-voltage transistor may be arranged in the high-breakdown-voltage transistor region R3.

Herein, in the semiconductor substrate 10, the cell array region R0, the sense amplifier region R1, the peripheral region R2, and the high-breakdown-voltage transistor region R3 are isolated by element isolation layers 11. Also, the element isolation layer 11 may use, for example, a shallow-trench isolation (STI) structure. Also, a material of the element isolation layer 11 may use, for example, $SiO_2$.

In the cell array region R1, a cell N well NW0 is formed on the semiconductor substrate 10, and also, a cell P well PW0 is formed in the inside thereof. A floating gate electrode 15 and select gate lines SGS and SGD are arranged on the cell P well PW0. Also, by forming a control gate electrode 16 on the floating gate electrode 15, word lines WL1 to WLh are constituted. Also, the cell P well PW0 and the floating gate electrode 15 may be insulated through a tunnel insulating film that is not illustrated. The floating gate electrode 15 and the control gate electrode 16 may be insulated through an inter-electrode insulating film that is not illustrated. Herein, one floating gate electrode 15 on the cell P well PW0 and the control gate electrode 16 thereon may constitute one memory cell.

In the cell P well PW0, N-type impurity diffusion layers 12 are formed between the floating gate electrodes 15 or between the floating gate electrode 15 and the select gate lines SGS and SGD. Also, an N-type impurity diffusion layer 13 is formed on one side of the select gate line SGD, and an N-type impurity diffusion layer 14 is formed on one side of the select gate line SGS.

The N-type impurity diffusion layer 13 is connected to a bit line BL through a contact electrode 18, and the N-type impurity diffusion layer 14 is connected to a source line SL through a contact electrode 17. Also, the control gate electrodes 16 of the respective memory cells are connected to the word lines WL1 to WLh.

Also, a P-type impurity diffusion layer 23 is formed around the cell P well PW0, and an N-type impurity diffusion layer 24 is formed around the cell N well NW0. Also, a P-type impurity diffusion layer 27 is formed in the semiconductor substrate 10. The impurity diffusion layers 23 and 24 are connected to a wiring H13 through contact electrodes 19 and 20. Also, the P-type impurity diffusion layer 23 may constitute a guard ring of the cell P well PW0, and the N-type impurity diffusion layer 24 may constitute a guard ring of the cell N well NW0, and the P-type impurity diffusion layer 27 may constitute a guard ring of the semiconductor substrate 10.

Also, in the sense amplifier region R1, a P well PW1 and an N well NW1 are formed in the semiconductor substrate 10. A gate electrode G4 is arranged on the P well PW1. Also, in the P well PW1, N-type impurity diffusion layers J4 and J5 are formed, with a channel region being disposed therebetween under the gate electrode G4. The N-type impurity diffusion layer J4 is connected to a wiring H3B (not illustrated) through a contact electrode SC4, and the N-type impurity diffusion layer J5 is connected to a wiring H2 (not illustrated) through a contact electrode SC5. A P-type impurity diffusion layer J6 is connected to a wiring H3B (not illustrated) through a contact electrode SC6. The P-type impurity diffusion layer J6 may constitute a guard ring of the P well PW1, where 0 V is applied. Also, gate electrodes G5 and G6 are arranged on the N well NW1. Also, in the N well NW1, P-type impurity diffusion layers J8 and J9 are formed, with a channel region being disposed therebetween under the gate electrode G6. The P-type impurity diffusion layer J9 is connected to a wiring H1 (not illustrated) through a contact electrode SC9. An N-type impurity diffusion layer J10 may constitute a guard ring of the N well NW1, where an internal power supply voltage in a chip (for example, about 1.8 V to 3 V) is applied.

Also, in the peripheral region R2, a P well PW2 and an N well NW2 are formed in the semiconductor substrate 10. Gate electrodes G11 and G12 are arranged on the P well PW2. Also, in the P well PW2, N-type impurity diffusion layers J11 and J12 are formed, with a channel region being disposed therebetween under the gate electrode G11. The N-type impurity diffusion layer J11 is connected to a wiring PH15 (not illustrated) through a contact electrode SC11, and the N-type impurity diffusion layer J12 is connected to a wiring H14 (not illustrated) through a contact electrode SC12. For simplicity of the drawing, a guard ring of the P well PW2 is not illustrated. Also, the gate electrode G14 is arranged on the N well NW2. Also, in the N well NW2, P-type impurity diffusion layers J17 and J18C are formed, with a channel region being disposed therebetween under the gate electrode G14. The P-type impurity diffusion layer J17 is connected to the wiring PH12 (not illustrated) through a contact electrode SC17, and the P-type impurity diffusion layer J18C is connected to a wiring PH13A (not illustrated) through a contact electrode SC18C. For simplicity of the drawing, a guard ring of the N well NW2 is not illustrated.

Also, in the high-breakdown-voltage transistor region R3, a gate electrode GH is arranged on the semiconductor substrate 10. Also, in the semiconductor substrate 10, N-type impurity diffusion layers 25 and 26 are formed, with a channel region being disposed therebetween under the gate electrode GH. The N-type impurity diffusion layer 25 is connected to the wiring H14 through a contact electrode 21 and the wiring H14 is connected to the bit line BL through a contact electrode 23. Also, the N-type impurity diffusion layer 26 is connected to a wiring H15 through a contact electrode 22, and the wiring H15 is connected to a wiring H11 through a contact electrode 22. The wiring H11 may be connected to the sense amplifier region R1.

Herein, it is preferable that the longer sides of the contact electrodes SC1 to SC10 of the sense amplifier units 7A and 7B be smaller than the longer sides of the contact electrodes SC11 to SC17, SC18A to SC18C, SC19 and SC20 of the peripheral circuit 9. Also, it is preferable that the longer sides of the contact electrodes SG3 to SG6 of the sense amplifier units 7A and 7B be smaller than the longer sides of the contact electrodes CG13 and SG14 of the peripheral circuit 9. Also, it is preferable that the longer sides of the contact electrodes SC1 to SC10 of the sense amplifier units 7A and 7B be longer than the longer side of the bit line contact electrode BC of the memory cell arrays 2 and 3.

This makes it possible to prevent contact failure of the contact electrodes SC11 to SC17, SC18A to SC18C, SC19 and SC20 of the peripheral circuit 9, and to cope with the miniaturization of the sense amplifier units 7A and 7B while suppressing contact failure of the contact electrodes SC1 to SC10 of the sense amplifier units 7A and 7B.

Also, it is preferable that the minor axes of the contact electrodes SC1 to SC10 of the sense amplifier units 7A and 7B be smaller than the minor axes of the contact electrodes SC11 to SC17, SC18A to SC18C, SC19 and SC20 of the peripheral circuit 9. Also, it is preferable that the minor axes of the contact electrodes SG3 to SG6 of the sense amplifier units 7A and 7B be smaller than the minor axes of the contact electrodes CG13 and SG14 of the peripheral circuit 9. Also, it is preferable that the minor axes of the contact electrodes SC1 to SC10 of the sense amplifier units 7A and 7B be longer than the minor axis of the bit line contact electrode BC of the memory cell arrays 2 and 3.

Herein, by reducing the minor axes of the contact electrodes SC1 to SC10 and SG3 to SG6, for example, the interval between the contact electrode SC4 and the wiring H2 of FIG. 6 may be increased. Therefore, it is possible to cope with the miniaturization of the sense amplifier units 7A and 7B while suppressing the contact failure of the contact electrodes SC1 to SC10 and SG3 to SG6 of the sense amplifier units 7A and 7B.

Second Embodiment

FIG. 9A is a top view illustrating a layout configuration example of transistors used for a sense amplifier according to a second embodiment.

In FIG. 9A, an active area A21 is provided in a sense amplifier, and gate electrodes G21 to G23 are arranged to cross the active area A21. Impurity diffusion layers J21 to J24 are formed in the respective active areas A21 divided by the gate electrodes G21 to G23, and contact electrodes SC21 to SC24 are arranged on the respective impurity diffusion layers J21 to J24.

Herein, transistors constituted by the gate electrodes G21 and G22 are arranged in a region R21 that is replaceable by redundancy, and a transistor constituted by the gate electrode G23 is arranged in a region R22 that is irreplaceable by redundancy. In this case, it is preferable that the longer sides of contact electrodes SC23 and SC24 arranged in the region R22 irreplaceable by reducdancy be longer than the longer sides of contact electrodes SC21 and SC22 arranged in the region R21.

This may reduce the area occupied by the active area A21 in the region R21 replaceable by redundancy. Therefore, it is possible to achieve the miniaturization of the sense amplifier, and it is possible to suppress the contact failure of the contact electrodes SC23 and SC24 in the non-replacement region R22.

Third Embodiment

FIG. 9B is a top view illustrating a layout configuration example of transistors used for a sense amplifier according to a third embodiment.

In FIG. 9B, an active area A31 is provided in a sense amplifier, and gate electrodes G31 to G33 are arranged to cross the active area A31. Impurity diffusion layers J31 to J34 are formed in the respective active areas A31 divided by the gate electrodes G31 to G33, and contact electrodes SC31 to SC34 are arranged on the respective impurity diffusion layers J31 to J34.

Herein, a transistor constituted by the gate electrode G31 is arranged in a region R31 that may cope with a high-speed operation, and transistors constituted by the gate electrodes G32 and G33 are arranged in a region R32 that may not cope with a high-speed operation. In this case, it is preferable that the longer sides of the contact electrodes SC31 and SC32 arranged in the region R31 to cope with the high-speed operation be longer than the longer sides of the contact electrodes SC33 and SC34 arranged in the region R32.

This may reduce the area occupied by the active area A31 in the region R32 not to cope with high-speed operation. Therefore, it is possible to achieve the miniaturization of the sense amplifier, and it is possible to reduce the contact resistance of the contact electrodes SC31 and SC32 in the region R32 not to cope with high-speed operation, achieving the high-speed operation of the sense amplifier. The present embodiment is also effective to the N-channel field-effect transistor, but in particular, is effective when applying to the P-channel field-effect transistor.

Also, the above-described embodiments have described the configuration in which one sense amplifier is provided for every one bit line. However, in the configuration in which when one of an even bit line and an odd bit line operates, the other bit line operates as a shield wiring, one sense amplifier may be provided for every two bit lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A nonvolatile semiconductor memory device comprising:
a memory cell array including memory cells;
a word line electrically connected to one of the memory cells;
m bit lines, one of the bit lines being electrically connected to one of the memory cells, m being an integer equal to or greater than 2, the m bit lines extending in a first direction; and
k sense amplifiers disposed within a first width of k bit lines, k being an integer equal to or greater than 2 and equal to or less than m, k sense amplifiers including a first sense amplifier and a second sense amplifier, the first sense amplifier including first to fifth lines and transistors, the transistors being disposed one by one in the first direction, gates of the transistors being parallel to one another, a longer side width of a first contact electrically connected to an active area of the transistor is substantially identical to a width of the bit line, the first and second lines being capable of transferring a complementary data, the third line being a power line, the fourth line being electrically connected to at least one of the transistors, the fifth line being electrically connected to the second sense amplifier.

2. The nonvolatile semiconductor memory device according to claim 1,
further comprising a peripheral circuit including a second contact electrically connected to an active area of the peripheral circuit,
wherein a longer side width of the first contact is smaller than a longer side width of the second contact.

3. The nonvolatile semiconductor memory device according to claim 1,
wherein a longer side width of a third contact electrically connected to an active area of a P-channel transistor in the first sense amplifier is longer than a longer side width of a fourth contact electrically connected to an active area of an N-channel transistor in the first sense amplifier.

4. The nonvolatile semiconductor memory device according to claim 1,
wherein in the first sense amplifier, a longer side width of a fifth contact electrically connected to an active area of a transistor, which is not repairable by a redundancy, is longer than a longer side width of a sixth contact electrically connected to an active area of a transistor, which is repairable by the redundancy.

5. The nonvolatile semiconductor memory device according to claim 1,
wherein a NAND string is constituted by connecting a plurality of memory cells in series.

6. The nonvolatile semiconductor memory device according to claim 1, wherein the k is power of 2.

7. The nonvolatile semiconductor memory device according to claim 1,
wherein a NAND string is constituted by connecting a plurality of memory cells in series.

8. The nonvolatile semiconductor memory device according to claim 1, further comprising a sixth line configured to prevent latch data from being inverted.

9. The nonvolatile semiconductor memory device according to claim 1, wherein
the transistors constitutes a latch circuit, a first transistor, and a second transistor, the latch circuit including first and second inverters, the first transistor being configured to perform a data transfer within the first sense amplifier, the second transistor being configured to perform a data transfer between the first and second sense amplifiers.

10. A nonvolatile semiconductor memory device comprising:
a memory cell array including memory cells;

a word line electrically connected to one of the memory cells;

m bit lines, one of the bit lines being electrically connected to one of the memory cells, m being an integer equal to or greater than 2, the m bit lines extending in a first direction; and k sense amplifiers disposed within a first width of k bit lines, k being an integer equal to or greater than 2 and equal to or less than m, transistors constituting the sense amplifier being arranged one by one within the first arrangement width of the sense amplifier in the direction of the bit lines, a gate length direction of the transistors being parallel with the direction of the bit lines, a peripheral circuit;

a first contact connected to an active area of the memory cell array; and a second contact connected to an active area of the peripheral circuit; and a third contact connected to an active area of the sense amplifier, a longer side direction of the third contact is identical to the direction of the bit lines, a longer side of the third contact being longer than a longer side of the first contact and smaller than a longer side of the second contact.

11. The nonvolatile semiconductor memory device according to claim 10, wherein a longer side width of a fourth contact electrically connected to an active area of a P-channel transistor in the sense amplifier is longer than a longer side width of a fifth contact electrically connected to an active area of an N-channel transistor in the sense amplifier.

12. The nonvolatile semiconductor memory device according to claim 10, wherein in the sense amplifier, a longer side of a contact connected to an active area of a transistor, which is not repairable by a redundancy, is longer than a longer side of a contact connected to an active area of a transistor, which is repairable by the redundancy.

13. The nonvolatile semiconductor memory device according to claim 10, wherein a NAND string is constituted by connecting a plurality of memory cells in series.

14. The nonvolatile semiconductor memory device according to claim 10, wherein the k sense amplifiers include a first sense amplifier and a second sense amplifier, the first sense amplifier including first to fifth lines, the first and second lines being capable of transferring a complementary data, the third line being a power line, the fourth line being electrically connected to at least one of the transistors, the fifth line being electrically connected to the second sense amplifier.

15. The nonvolatile semiconductor memory device according to claim 11, wherein the transistors constitutes a latch circuit, a first transistor, and a second transistor, the latch circuit including first and second inverters, the first transistor being configured to perform a data transfer within the first sense amplifier, the second transistor being configured to perform a data transfer between the first and second sense amplifiers.

16. The nonvolatile semiconductor memory device according to claim 10, wherein the first contact is a bit line contact.

* * * * *